US006697001B1

(12) United States Patent
Oliaei et al.

(10) Patent No.: US 6,697,001 B1
(45) Date of Patent: Feb. 24, 2004

(54) CONTINUOUS-TIME SIGMA-DELTA MODULATOR WITH DISCRETE TIME COMMON-MODE FEEDBACK

(75) Inventors: Omid Oliaei, Schaumburg, IL (US);
Matthew R. Miller, Palatine, IL (US);
Patrick L. Rakers, Kildeer, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/324,684

(22) Filed: Dec. 19, 2002

(51) Int. Cl.$^7$ .............................................. H03M 3/02
(52) U.S. Cl. .................... 341/143; 330/258; 327/552
(58) Field of Search .................... 341/143; 327/552, 327/553, 558, 560, 563; 330/258

(56) References Cited

U.S. PATENT DOCUMENTS

| | | | | |
|---|---|---|---|---|
| 4,573,020 A | | 2/1986 | Whatley | 330/258 |
| 4,749,956 A | * | 6/1988 | Torelli et al. | 330/253 |
| 5,359,294 A | * | 10/1994 | Ganger et al. | 330/258 |
| 5,729,130 A | * | 3/1998 | Jensen et al. | 341/143 |
| 5,838,200 A | * | 11/1998 | Opris | 330/258 |
| 5,847,601 A | * | 12/1998 | Wang | 330/9 |
| 5,963,084 A | * | 10/1999 | Eschauzier | 327/553 |

OTHER PUBLICATIONS

Duque–Carrillo, J. F. et al., Input Common–Mode Feedback Technique for Very Low Voltage CMOS Amplifiers, Jul. 1999, IEEE 1999 International Symposium on Circuits and Systems (ISCAS '99) Proceedings, vol. 2, pp. 25–28.*
Luh, Louis et al., A Continuous–Time Common–Mode Feedback Circuit (CMFB) for High–Impedance Current–Mode Applications IEEE Transactions on Circuits and Systems–II. Analog and Digital Signal Processing, vol. 47 No. 4, Apr. 2000, pp. 363–369.*

Gerfers, F. et al., A 1.5 V Low–Power Third Order Continuous–Time Lowpass Sigma–Delta A/D Converter, IEEE, 2000 International Symposium on Low Power Electronics and Design (ISLPED '00), Jul. 2000, pp. 219–221.*

Malcovati, P., et al., A High–Swing, 1.8 V, Push–Pull Op–Amp for Sigma–Delta Modulators, 1998 IEEE International Conference on Electronics, Circuits and Systems, Sep. 1998, vol. 1, pp. 33–36.*

Duque–Carrillo, "Continuous–time common–mode feedback networks for fully–differential amplifiers: a comparative study," in *Proceedings 1993 IEEE International Symposium on Circuits and Systems*, pp. 1267–1270, Jun. 1993.

* cited by examiner

*Primary Examiner*—Howard L. Williams
(74) *Attorney, Agent, or Firm*—Fulbright & Jaworski, LLP

(57) ABSTRACT

Systems and methods are described for a continuous-time sigma-delta modulator with discrete time common-mode feedback. The method includes calculating an integrator input signal as a difference between an input signal and a modulation feedback signal, continuous time integrating the integrator input signal to produce an integrator output signal having a common mode voltage, determining the common mode voltage of the integrator output signal using a discrete-time process, determining an integrator feedback signal as a function of the common-mode voltage and feeding back the feedback signal to the integrator in order to maintain the common mode voltage at a substantially constant value, sampling and quantizing the integrator output signal to produce a sigma-delta modulated output signal and converting the sigma-delta modulated output signal from a digital signal to an analog signal, to produce the modulation feedback signal.

29 Claims, 8 Drawing Sheets

CONTINUOUS-TIME SIGMA-DELTA MODULATOR WITH DISCRETE TIME COMMON-MODE FEEDBACK

BACKGROUND OF THE INVENTION

1. Field of the Invention

The invention relates generally to the field of analog to digital sigma-delta signal modulation.

2. Discussion of the Related Art

Discrete-time (DT) sigma-delta modulators have been successfully implemented using switched-capacitor techniques during the past decade. In a switched-capacitor implementation of sigma-delta modulators, integrators are required to settle with an adequately small error at the end of each clock phase. This calls for fast amplifiers and increased power dissipation. A second drawback of the switched-capacitor approach is aliasing of thermal noise and consequently increased in-band noise. Continuous-time (CT) sigma-delta modulation is an alternative way of converting analog signals to digital without the abovementioned drawbacks. In the CT-modulator, all integrators operate in the continuous-time domain and sampling occurs at the same time as quantization. As a consequence, CT-modulators are less demanding in terms of biasing current. Moreover, they provide an anti-aliasing filter without cost.

In the current state of the semiconductor technology nearly all analog integrated circuits are realized using fully-differential structures in order to improve immunity to noise and device inaccuracies. Sigma-delta modulators which have become an indispensable part of most mixed-signal circuits are required to be immune to the large amount of noise inherent to the switching environment of this class of circuits. Furthermore, differential structures offer 3dB of signal-to-thermal noise improvement.

However, these advantages are gained only at the price of additional circuitry necessary to control the output common-mode voltage of a differential structure. On the other hand, this portion of the circuit is desired not to affect the processing of the input signal. Since the common-mode feedback (CMFB) circuit cannot be designed independently from the differential portion of the circuit, optimum design of fully-differential structures is usually subject to many trade-offs.

SUMMARY OF THE INVENTION

There is a need for the following embodiments. Of course, the invention is not limited to these embodiments.

In accordance with one aspect of the invention, a method for continuous-time sigma-delta modulation of an input signal includes, calculating an integrator input signal as a difference between the input signal and a modulation feedback signal, continuous time integrating the integrator input signal to produce an integrator output signal having a common mode voltage, determining the common mode voltage of the integrator output signal using a discrete-time process, determining an integrator feedback signal as a function of the common-mode voltage and using the integrator feedback signal to maintain the common mode voltage at a substantially constant value, sampling and quantizing the integrator output signal to produce a sigma-delta modulated output signal, and converting the sigma-delta modulated output signal from a digital signal to an analog signal, to produce the modulation feedback signal.

In accordance with another aspect of the invention, an apparatus for continuous time sigma-delta modulation, includes an adder to calculate an integrator input signal as a difference between an input signal and a modulation feedback signal, a continuous time integrator to integrate the integrator input signal to produce an integrator output signal having a common mode portion, a discrete-time common mode feedback circuit which produces an integrator feedback signal as a function of the common mode portion of the integrator output signal, the feedback signal being used to maintain the common mode portion at a substantially constant value, a quantizer coupled to receive the integrator output signal and to produce a quantized output signal; and a digital-to-analog converter coupled to receive the quantized output signal to produce the modulation feedback signal. The continuous time integrator may be an active RC integrator or an active GmC integrator.

In accordance with yet another aspect of the invention, an apparatus for continuous time sigma-delta modulation includes a continuous time integrator to integrate an input signal to produce an integrator output signal having a common mode component, and a discrete-time common mode feedback circuit which produces an integrator feedback signal as a function of the common mode component of the integrator output signal, the integrator feedback signal being used by the continuous time integrator to maintain the common mode component at a substantially constant value. The continuous time integrator may be an active RC integrator or an active GmC integrator.

In accordance with another aspect of the invention, an electronic apparatus includes a continuous time integrator to integrate an integrator input signal to produce an integrator output signal having a common mode portion, and a discrete-time common mode feedback circuit which produces an integrator feedback signal as a function of the common mode portion of the integrator output signal, the integrator feedback signal being used by the continuous time integrator to maintain the common mode portion at a substantially constant value.

These and other features and embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/ or rearrangements.

BRIEF DESCRIPTION OF THE DRAWINGS

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DETAILED DESCRIPTION

The task of the common-mode feedback circuit in a differential structure includes controlling the output signals ($V_{op}$, $V_{om}$) so that their common-mode component, ($V_{op}$+$V_{om}$)/2, remains equal to a predetermined value. In this way, the output signals may vary symmetrically around the common-mode voltage. One operation performed in a common-mode feedback (CMFB) circuit is calculating the common-mode component of the differential signals and then applying a suitable feedback in order to make the measured common-mode voltage approximately equal to the desired value. There are two typical approaches to designing CMFB circuits: a continuous-time approach and a discrete-time approach. The difference between the two approaches resides in both the measurement and the adjustment of the common-mode voltage. Traditionally, the continuous-time method is used in purely continuous-time circuits, such as filters, while the discrete-time method is employed only in discrete-time circuits. In contrast with these classical cases, the present invention exploits the use of a discrete-time CMFB circuit in a continuous-time sigma-delta modulator.

Figure 1:
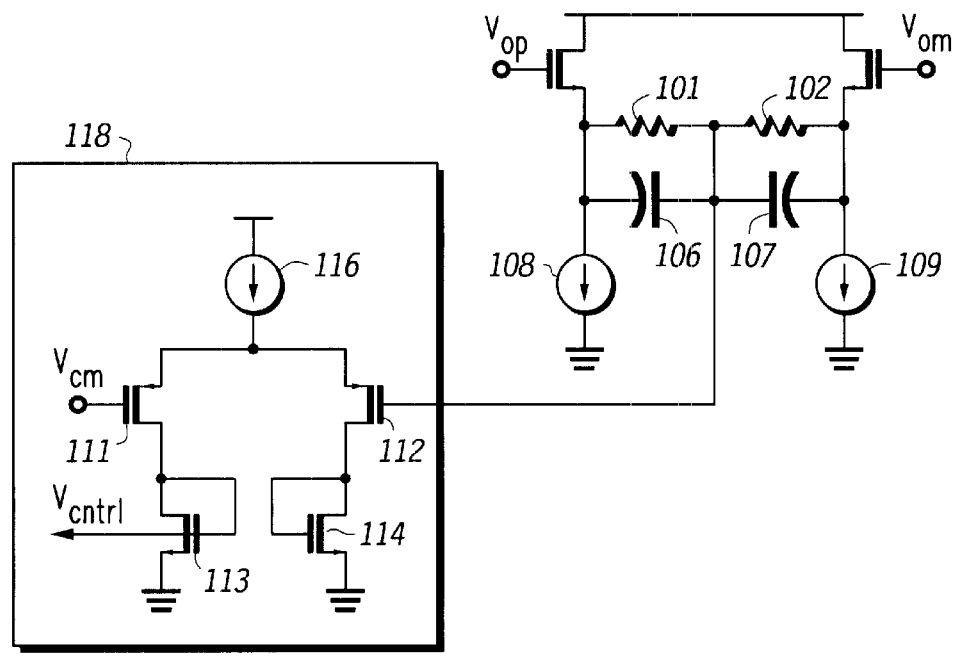
FIG. 1 is a prior art common-mode feedback circuit using buffers and resistors.
Figure 2:
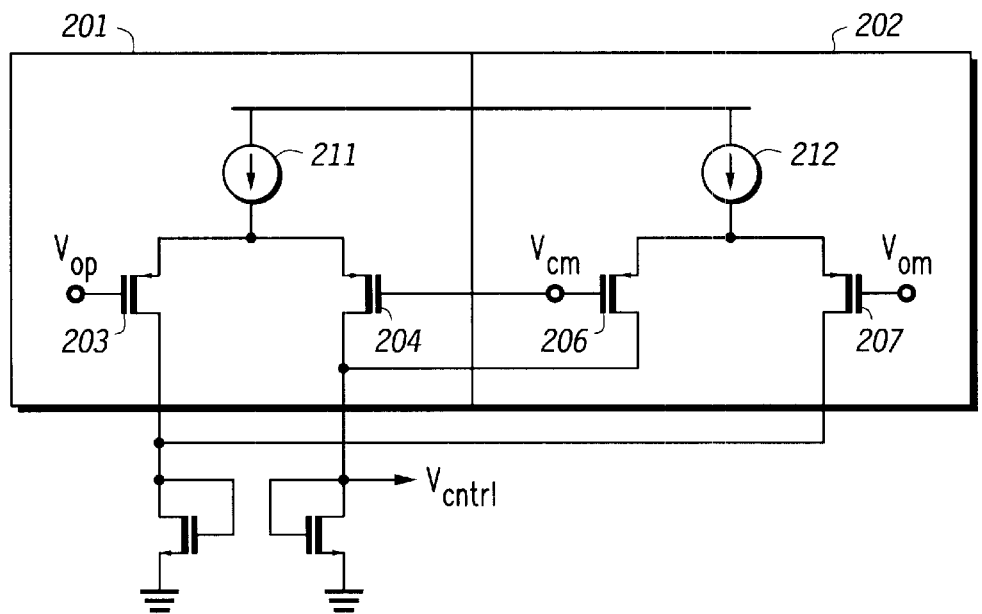
FIG. 2 is a prior art common-mode feedback circuit using differential amplifiers.
Figure 3:
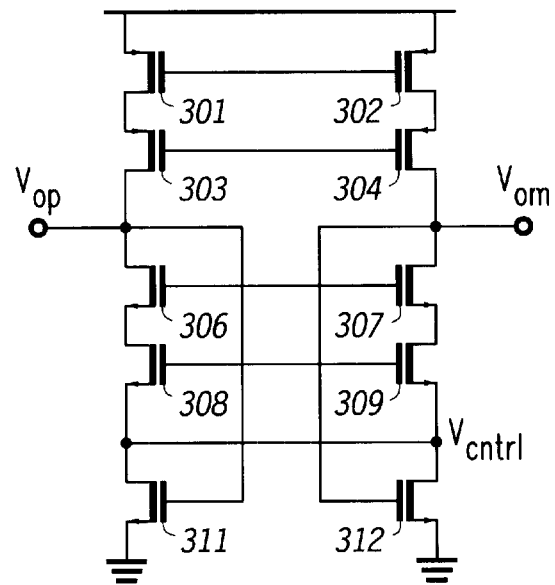
FIG. 3 is a prior art common-mode feedback circuit using transistors in the linear region.

Various continuous-time CMFB circuits differ from each other mainly in the way they extract the common-mode component of two signals. Three popular CMFB circuits are shown in FIG. 1, FIG. 2 and FIG. 3. Other variants of these circuits have also been proposed.

In FIG. 1, and all subsequent figures, the presence of a dot at the junction of circuit elements and lines representing wires denotes a connection between the circuit elements and wires. The first circuit, as shown in FIG. 1, generates the common-mode voltage of the output signals (minus a DC level shift) that are the inputs to the transistors, by means of two resistors 101, 102, that are coupled to the same two transistors, at their respective sources. Two capacitors, 106, 107, are coupled in parallel to the resistors 101, 102, and each transistor, also has a current source 108, 109 coupled to its respective sources following the resisters 101, 102, and capacitors 106, 107.

The common mode voltage generated by the two resistors 101, 102, is coupled to the gate of one of the transistors 112 in a buffer circuit 118. The gate of the other transistor in the buffer circuit 111 is coupled to the reference common mode voltage against which the common mode voltage generated by the two resistors 101, 102 is compared. This buffer circuit 118 is comprised of a current source 116 that is coupled to the source of two transistors 111, 112 whose sources are coupled to both the drains and the gates of two additional transistors 113, 114, whose sources are coupled to ground. $V_{cntrl}$, the control voltage that is fed back, is obtained from the drain of transistor 111 which has the reference common mode voltage ($V_{cm}$) coupled to its gate.

Buffers may be used to avoid the loading effect of the resistors, 101, 102. The resistors 101, 102 are required to have large values for low power and also required to be very linear (the resistors in integrators generally have non-linear characteristics) for an accurate common-mode control. This technique can be quite expensive both in terms of silicon area due to the increased size of the resistors and the design of linear resistors.

The second method shown in FIG. 2 makes use of two differential-amplifiers 201, 202, each with its own respective current source 211, 212, in order to extract the common-mode component. The reference common mode voltage is coupled to the gate of a transistor in each differential-amplifier 204, 206. $V_{cntrl}$, the control voltage that is fed back, is obtained from the drain of transistor 204. For proper operation, none of the transistors 203, 204, 206, 207 constituting the two differential-pairs should turn off. This condition requires a high $V_{gs}$ (voltage difference between the gate and the source of the transistor) for these transistors 203, 204, 206, 207. However, a large $V_{gs}$ has the disadvantages of reduced output swing for the main amplifier and reduced gain and bandwidth for the common-mode amplifier.

The third approach shown in FIG. 3 makes use of transistors 301–304, 306–309, 311–312. The transistors 311–312 operate in the linear region. As shown in FIG. 3, the transistors 301, 303, 306, 308, 311 are coupled together from the drain of one to the source of another. This pattern is repeated with transistors 302, 304, 307, 309, 312. These two sets of transistors are then coupled together by their gates, transistor 301 to transistor 302, transistor 303 to transistor 304, transistor 306 to transistor 307, and transistor 308 to transistor 309. The gate of transistor 311, the drain of transistor 303, and the drain of transistor 306 are coupled to $V_{op}$. The gates of transistor 312, the drain of transistor 304, and the drain of transistor 307 are coupled to $V_{om}$. This pattern creates a differential amplifier circuit which functions like the ones shown in FIG. 1 and FIG. 2, with the $V_{cntrl}$ being the control voltage that is fed back. The reference common mode voltage node is not shown in this figure. One drawback of this technique is its low common-mode gain which makes the common-mode voltage less accurate than what is expected.

Figure 4:
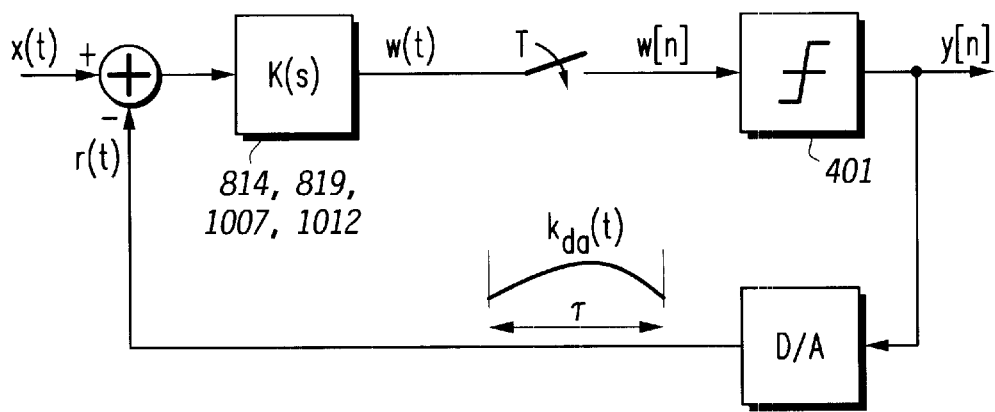
FIG. 4 is a general structure of a continuous-time sigma-delta modulator, in accordance with an embodiment of the present invention.

FIG. 4 shows the general structure of a continuous-time sigma-delta modulator in accordance with the present invention. An input signal x(t) is processed by the loop transfer function K(s) and emerges as signal w(t). This loop transfer function would implement one or more systems comprised of integrators 819, 1012 and common mode feedback circuits 814, 1007 examples of which are shown in FIGS. 8–13. Examples of the common mode feedback circuits are shown and described in FIGS. 5–6. w(t) is periodically sampled at time intervals T as a continuous time signal and becomes w[n], which is then sent through a quantizer 401. In actual application, the sampling of w(t) at T may be accomplished substantially simultaneously with the signal processing done by the quantizer 401. The quantizer 401 digitizes the signal and outputs it as y[n] which is a sigma-delta modulated signal. y[n] is also applied a digital-to-analog converter which transforms it into analog signal r(t) and it is subtracted from the incoming signal x(t) as negative modulation feedback to continue the process.

The output of the system is a sigma-delta modulated digital signal which may be subject to filtering in order to reject the out-of-band noise. A discrete-time CMFB may not be used in a purely continuous-time system because of the clock-feedthrough glitches generated at switching instants.

However, this effect may not be an issue in the case of the CT-modulator because the feedback signal is itself a discrete-time signal. Furthermore, clock-feedthrough glitches generated by the CMFB give rise to a spectral component at the sampling frequency 1/T which does not affect the system performance. Numerous electrical simulations performed for a second-order continuous-time modulator including discrete-time common-mode feedback circuits have shown that discrete-time adjustment of the common-mode has no harmful effect on the output spectrum of the system.

It is known that a switched capacitor is electrically equivalent to a resistor whose value depends on the switching frequency and the capacitor value. This property allows for a simple implementation of a switched-capacitor common-mode feedback (SC-CMFB) circuit without the drawbacks encountered in the case of continuous-time circuits. Such an implementation may be useful in electronic devices. These electronic devices may include communication devices such as cellular phones.

Figure 5:
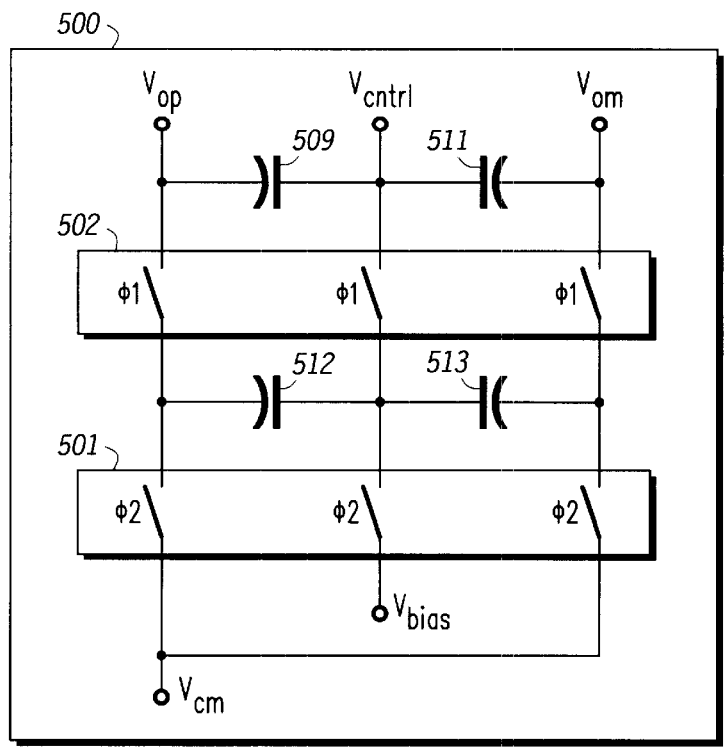
FIG. 5 is a switched-capacitor common-mode feedback circuit, in accordance with one aspect of the present invention.

FIG. 5 shows the structure of the SC-CMFB circuit 500, in accordance with the present invention. When the switches controlled by φ2 501 are closed, the switches controlled by φ1 502 are open and vice-versa. Only one set of switches is open or closed most of the time, except for brief intervals when the switches are in transition and at that time, they are both open. The switching frequency of the switches may be set according to the timing diagram shown in FIG. 7.

Figure 7:
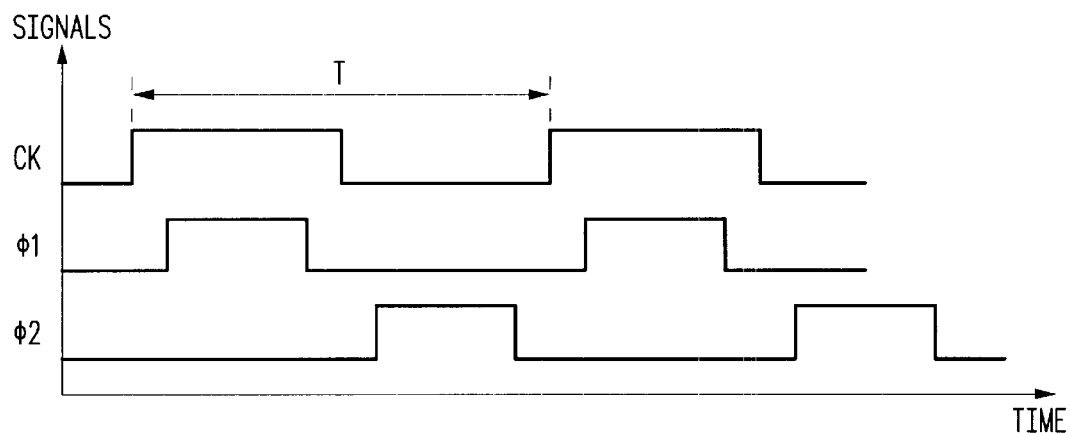
FIG. 7 is a timing diagram for the switches in the switched-capacitor circuits of FIGS. 5 and 6, in accordance with one aspect of the present invention.

In FIG. 7, T denotes the duration of one period of the clock. φ1 shows when the switches φ1 502 are turned on, and φ2 shows when the switches φ2 501 are turned on. The amount of time occupied by the intervals where both switches are open or turned off is exaggerated and not to scale. This switching measures the common mode components of signals $V_{op}$ and $V_{om}$ as needed to adjust $V_{cntrl}$, the control voltage that is fed back to produce the desired common mode voltage in the integrator circuits (see FIGS. 8–9 and 11–12). The reference common mode voltage that this is based on is coupled to the switches φ2 501. The capacitive load of the amplifier is larger when the switches φ1 502 are closed. The $V_{bias}$ shown is a control voltage that controls the biasing of the transistors in the integrator circuits.

The advantages that may occur with the use of the discrete-time CMFB (DT-CMFB) are in its simplicity and very low power consumption. Moreover, the output swing of the amplifier may not be limited in embodiments where no buffer is employed.

Figure 6:
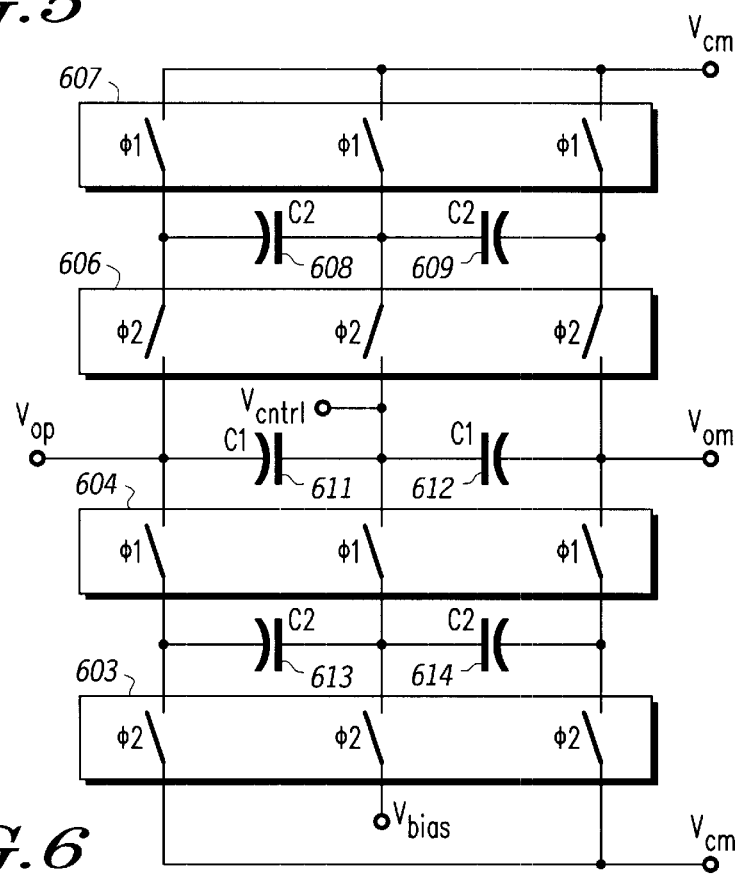
FIG. 6 is a symmetric switched-capacitor common-mode feedback circuit, in accordance with one aspect of the present invention.

A discrete-time CMFB similar to one shown in FIG. 5 may be used to control the output common-mode voltage of integrators in a continuous-time sigma-delta modulator. Using a symmetric SC-CMFB 600 as in FIG. 6, it may be possible to balance the capacitive load of the amplifier. FIG. 6 is the combination of 2 sets of the circuit shown in FIG. 5, hence the name symmetric SC-CMFB. The bottom half of the circuit which contains capacitors 611–614 and switches 603–604 is the same as that of FIG. 5. The remaining circuit elements, including capacitors 608–609 and switches 606–607, have been added to maintain the amplifier capacitive load constant.

The switches 606, 607 alternate positions—when one is in the on position, the other is off. The timing for the switches in FIG. 6 is the same as that for FIG. 5, as shown in FIG. 7 and previously discussed.

EXAMPLES

Specific embodiments of the invention will now be further described by the following, nonlimiting examples which will serve to illustrate in some detail various features. The following examples are included to facilitate an understanding of ways in which the invention may be practiced. It should be appreciated that the examples which follow represent embodiments discovered to function well in the practice of the invention, and thus can be considered to constitute preferred modes for the practice of the invention. However, it should be appreciated that many changes can be made in the exemplary embodiments which are disclosed while still obtaining like or similar result without departing from the spirit and scope of the invention. Accordingly, the examples should not be construed as limiting the scope of the invention.

Example 1

Figure 8:
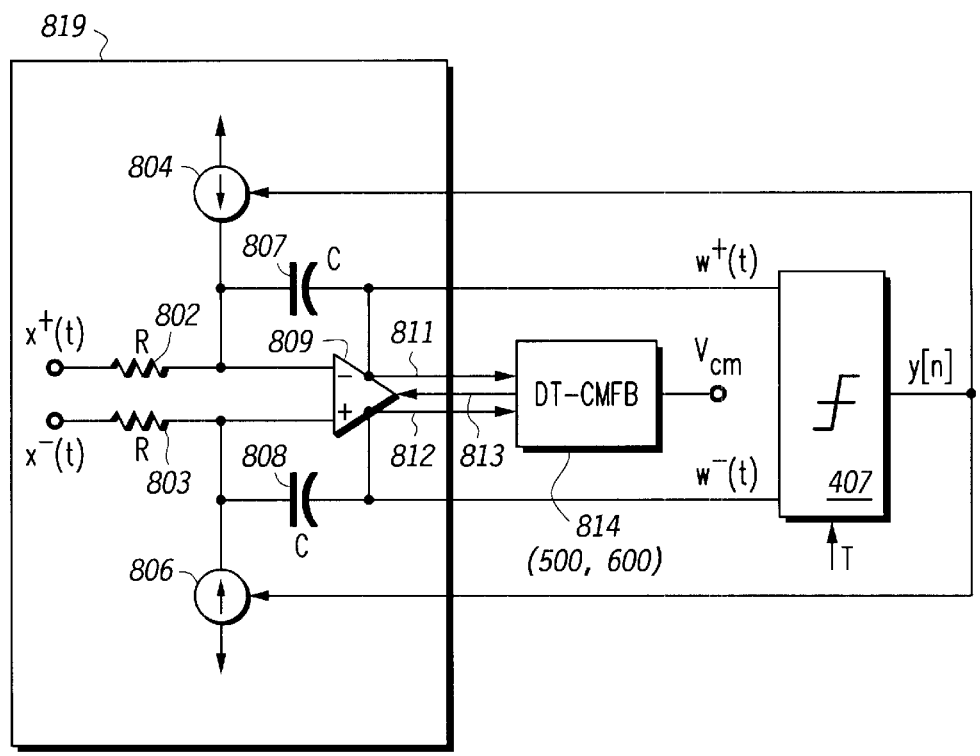
FIG. 8 is a first order continuous-time sigma delta modulator with a discrete-time common-mode feedback circuit using an active RC-integrator, in accordance with an embodiment of the present invention.
Figure 9:
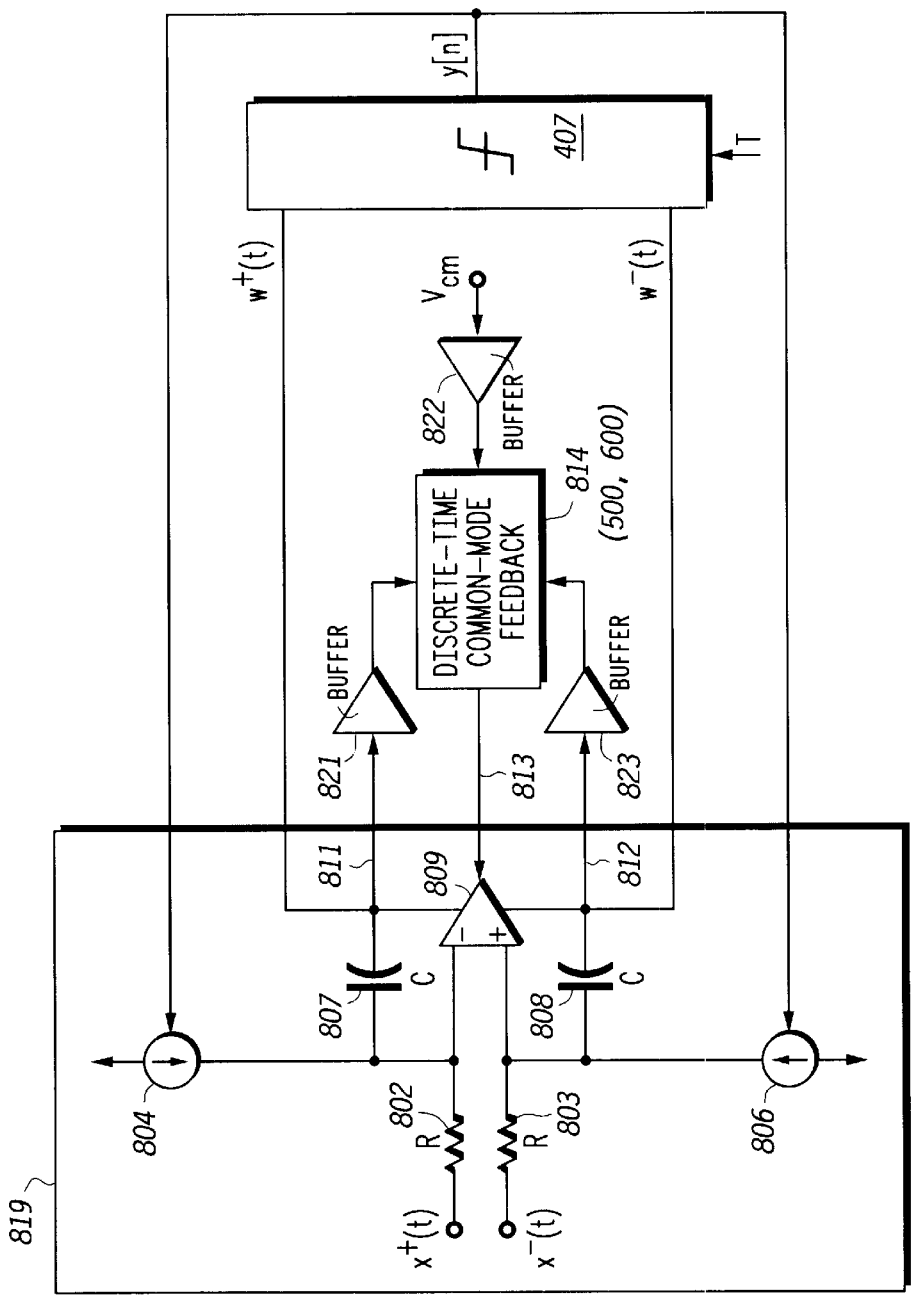
FIG. 9 is a first order continuous-time sigma delta modulator with buffers and discrete-time common-mode feedback using an active RC-integrator, in accordance with another embodiment of the present invention.

FIGS. 8 and 9 shows the coupling of an active RC-integrator and the common-mode feedback circuit, which would be one of the systems that would implement the loop function [K(s)] described in FIG. 4, in a sigma-delta modulator. FIG. 8 uses an active RC (resistor-capacitor)-integrator 819, comprising an op-amp circuit 809, two resistors 802–803, two capacitors 807–808, and two current sources 804, 806. The two resistors 802–803 are coupled between the inputs of the integrator-801 and the op-amp circuit 809. The capacitor 807 is coupled to both current source 804 and resistor 802 at one end, and its other end is coupled to the quantizer 407. The capacitor 808 is coupled to both current source 806 and resistor 803 at one end, and its other end is coupled to the quantizer 409. The output of the quantizer is y[n], and is coupled to the two current sources 804, 806. The inputs to the integrator 819 are the differences between $x^+(t)$ and $x^-(t)$, the differential components of x(t) as shown in FIG. 4, and the output of the common-mode feedback circuit 814.

The differential outputs 811, 812 of the integrator 819 are fed into the inputs of the discrete-time common-mode feedback circuit 814 as $V_{om}$ and $V_{op}$. In this first order circuit, these differential outputs 811, 812 also are $w^+(t)$ and $w^-(t)$, the differential components of w(t) which is the output of K(s) as shown in FIG. 4. These differential signals $w^+(t)$ and $w^-(t)$ are periodically sampled at time T and are coupled to a quantizer 407 which outputs a digital signal y[n]. In a $2^{nd}$, $3^{rd}$, $4^{th}$, or multiple-order circuit, these differential outputs w⁺(t) and w⁻(t) of the integrators, with the exception of the last integrator in the cascade, become the inputs into the following integrator, x⁺(t) and x⁻(t). The outputs of the last integrator act the same as the output of an integrator of a 1$^{st}$ order circuit.

Embodiments 500, 600 of the common-mode feedback circuit 814 are shown in FIG. 5 and FIG. 6. The reference common-mode voltage is fed into the common-mode feedback circuit 814. The output of the common-mode feedback circuit 813 is fed back into the active RC-integrator 819 to modify its differential outputs w⁺(t) and w⁻(t). The RC-integrator 819 integrates the difference between x⁺(t) and x⁻(t) and the output of the common-mode feedback circuit 812.

As shown in FIG. 9, The DT-CMFB 814 may be completely isolated from the amplifier in the integrator by adding buffers 821–823 between the amplifier 809, and the common-mode feedback circuit 814 and between the reference common mode voltage and the common-mode feedback circuit 814. FIG. 9 shows the same circuit as the circuit shown in FIG. 8 with buffers 821–823 added. The buffers 821–823 may be a simple source-follower stage 118 like the one shown in FIG. 1. Adding the buffers 821–823 reduces the maximum swing of the integrator 819. The need for buffers 821–823 depends on the specific design of the integrator 819. For example, if the integrating capacitors 807, 808 in FIG. 8 are large and the output resistance of the amplifier 809 is small enough, buffers 821–823 are likely not needed. In other instances, though, an additional buffer (not shown) may be needed between the output of the DT-CMFB 814 and the integrator 819.

Figure 10:
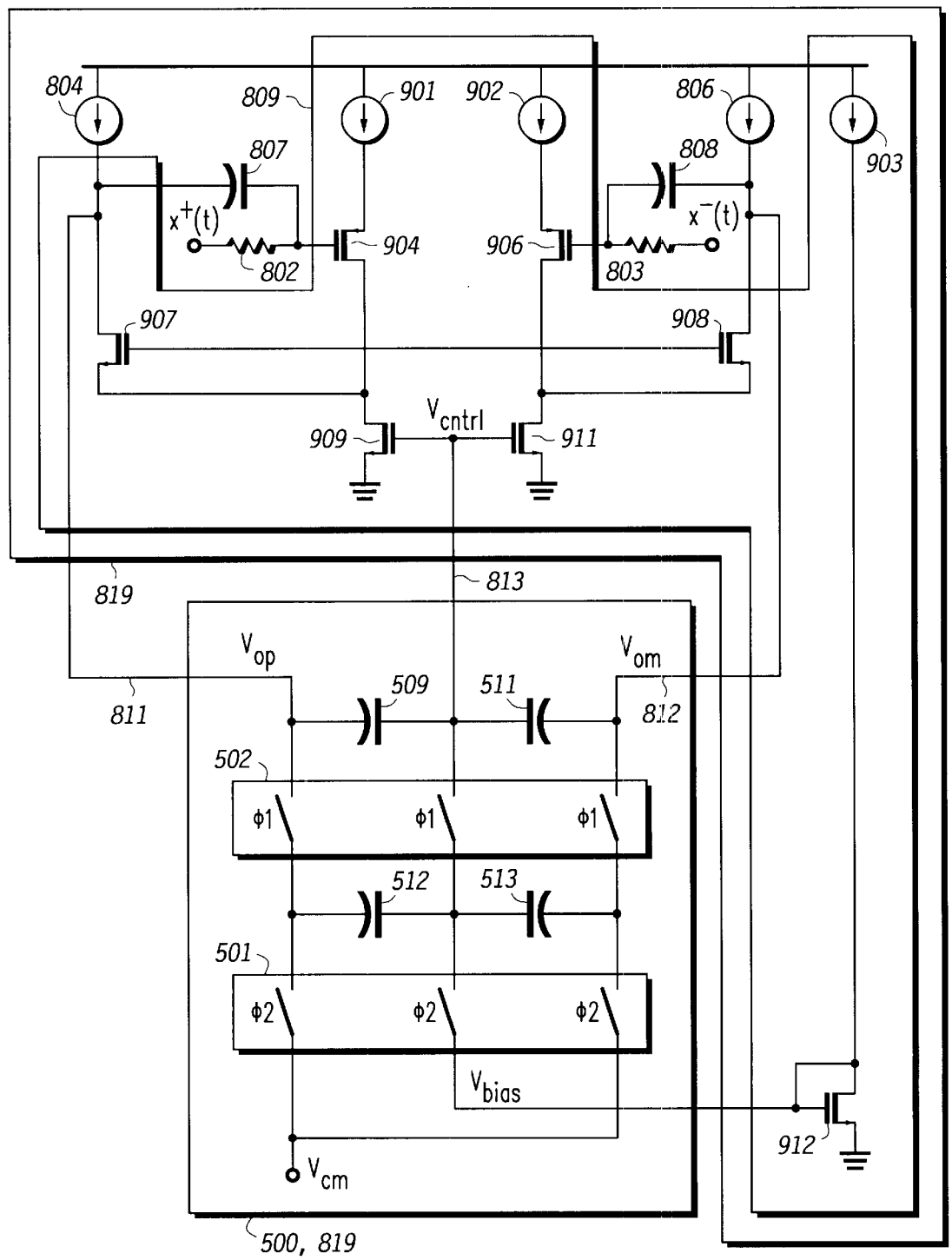
FIG. 10 is a circuit diagram of a continuous-time integrator with a discrete-time common-mode feedback circuit using an active RC-integrator, in accordance with yet another embodiment of the present invention.

FIG. 10 shows a circuit diagram of the continuous-time integrator with a discrete-time common-mode feedback circuit using an active RC-integrator shown in FIGS. 8–9 as an embodiment of the invention.

As shown, x⁺(t) and x⁻(t) are the inputs to the active RC-integrator 819, which comprises an op-amp circuit 809, two resistors 802–803, two capacitors 807–808, and two current sources 804, 806.

The op-amp circuit 809 is comprised of seven transistors 904, 906–909, 911, 912 and three current sources 901–903. x⁺(t), resistor 802, and capacitor 807 are coupled to the gate of transistor 904, while x⁻(t), resistor 803, and capacitor 808 are coupled to the gate of transistor 906. As shown in FIGS. 8–9, the resistors 802–803 are coupled to the input signals 801, respectively, and the capacitors 807–808 are coupled to the current sources 804, 806, respectively. The sources of transistors 904, 906 are coupled to the current sources 901, 902, respectively. The current source 804 is also coupled to the source of transistor 907 and V$_{op}$ of the DT-CMFB circuit 814. The DT-CMFB circuit 814 shown here is the switched-capacitor circuit 500 shown and discussed in FIG. 5.

The current source 806 is also coupled to the source of transistor 908 and V$_{om}$ of the DT-CMFB circuit 814. The gates of the transistors 907, 908 are coupled together, while their sources are coupled to transistors 909, 911, respectively. The gates of transistors 909, 911 are coupled together, and are also coupled to the output 813 of the DT-CMFB 814, V$_{cntrl}$. Current source 903 is coupled to the source and gate of transistor 912 while the drain is coupled to ground. The gate of transistor 912 is also coupled to V$_{bias}$ of the DT-CMFB circuit 814.

Example 2

Figure 11:
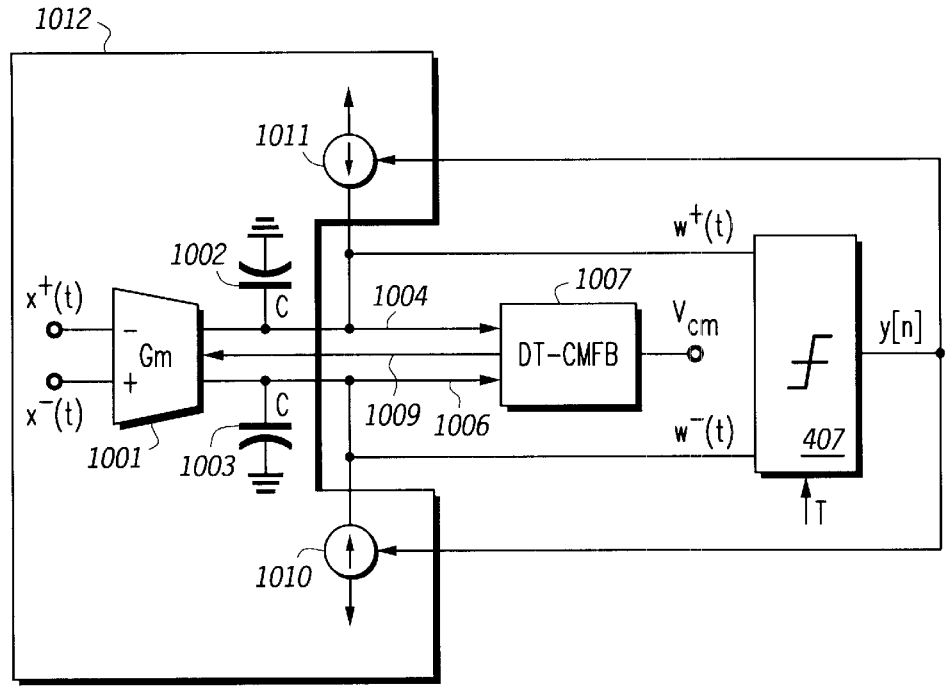
FIG. 11 is a first order continuous-time sigma delta modulator with a discrete-time common-mode feedback circuit using a GmC-integrator, in accordance with another embodiment of the present invention.
Figure 12:
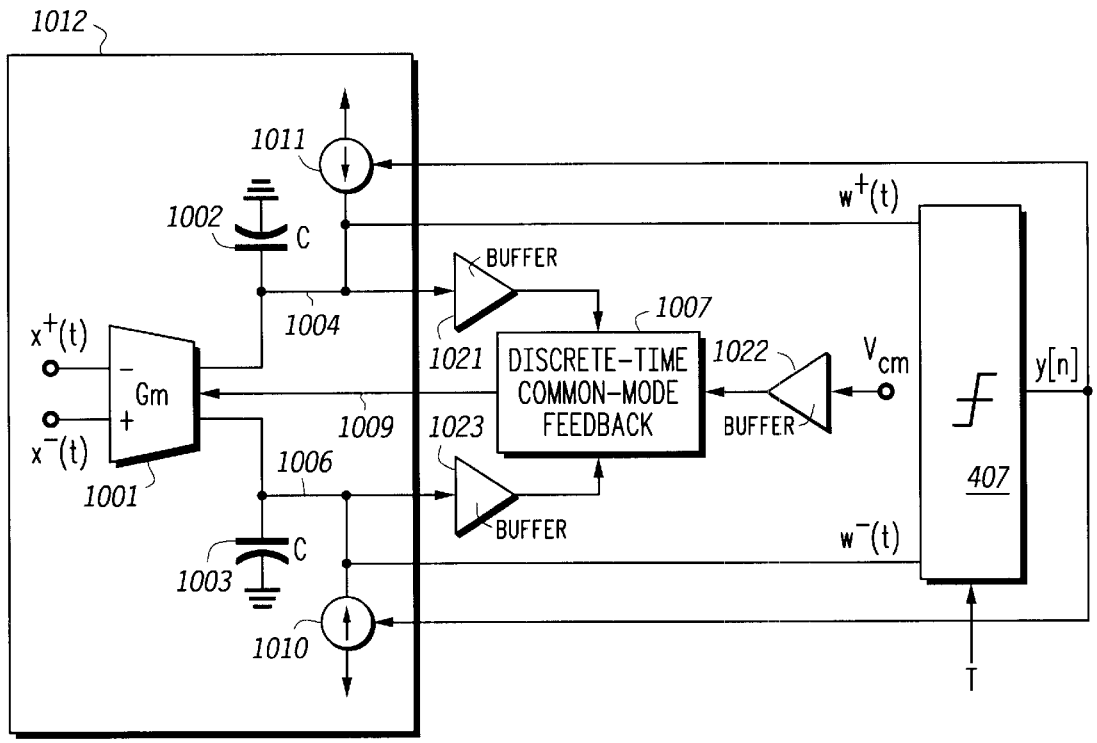
FIG. 12 is a first order continuous-time sigma delta modulator with buffers and discrete-time common-mode feedback using a GmC-integrator, in accordance with another embodiment of the present invention.

FIGS. 11–12 show the coupling of the GmC-integrator and the common-mode feedback circuit, which would be one of the systems that would implement the loop function, K(s), described in FIG. 4, in a sigma-delta modulator in accordance with the present invention. FIG. 11 is similar to FIG. 8, except that it uses a transconductance (GmC) integrator 1012, comprising an operational transconductance amplifier (OTA) circuit 1001, two capacitors 1002–1003, and two current sources 1010, 1011. The two capacitors 1002–1003 are coupled to the outputs of the OTA circuit 1001 which are also coupled to the two current sources 1010, 1011. The inputs to the integrator 1012 is the difference between x⁺(t) and x⁻(t), the differential components of x(t) as shown in FIG. 4, and the output of the common-mode feedback circuit 1007.

The differential outputs 1004, 1006 of the integrator 1012 are fed into the inputs of the discrete-time common-mode feedback circuit 1007 as V$_{om}$ and V$_{op}$. In this first order circuit, these differential outputs 1004, 1006 also are w⁺(t) and w⁻(t), the differential components of w(t) which is the output of K(s) as shown in FIG. 4. These differential signals 1004, 1006 are sampled at intervals T and are coupled to a quantizer 401 which outputs a digital signal y[n]. The output of the quantizer is y[n], which is coupled to the two current sources 1010, 1011. In a 2$^{nd}$, 3$^{rd}$, 4$^{th}$, or multiple-order circuit, the differential outputs 1004, 1006 of each integrator, with the exception of the last integrator in the cascade, become the inputs, x⁺(t) and x⁻(t), into the next integrator. The outputs of the last integrator would act the same as the output of an integrator of a 1$^{st}$ order circuit.

Embodiments 500, 600 of the common-mode feedback circuit 1007 are shown in FIG. 5 and FIG. 6. The reference common-mode voltage is fed into the common-mode feedback circuit 1007. The output of the common-mode feedback circuit 1009 is fed back into the GmC-integrator 1012 to modify its differential outputs w⁺(t) and w⁻(t). The GmC-integrator 1012 integrates the difference between x⁺(t) and x⁻(t) and the output of the common-mode feedback circuit 1007.

As shown in FIG. 12, The DT-CMFB 1007 may be completely isolated from the amplifier in the integrator by adding buffers 1021–1023 between the OTA amplifier 1001, and the common-mode feedback circuit 1007 and between the reference common mode voltage and the common-mode feedback circuit 1007. FIG. 12 shows the same circuit as the circuit shown in FIG. 11 with buffers 1021–1023 added. The buffers 1021–1023 maybe a simple source-follower stage 118 like the one shown in FIG. 1. Adding the buffers 1021–1023 reduces the maximum swing of the integrator 1012. The need for buffers 1021–1023 depends on the specific design of the integrator 1012. In some cases, an additional buffer (not shown) may be needed between the output 1009 of the DT-CMFB 1007 and the GmC-integrator 1012.

Figure 13:
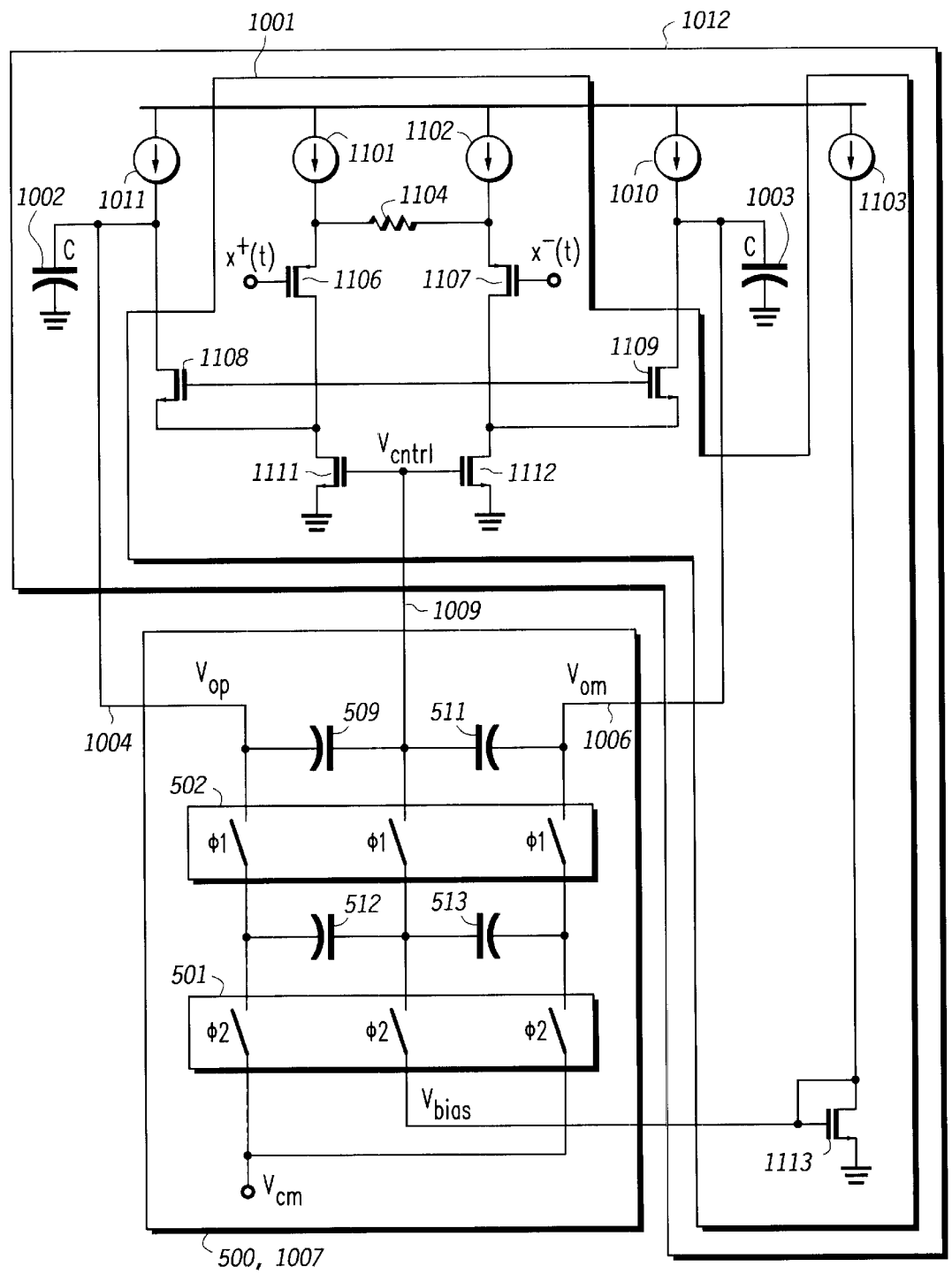
FIG. 13 is a circuit diagram of a continuous-time integrator with a discrete-time common-mode feedback circuit using a GmC-integrator, in accordance with another embodiment of the present invention.

FIG. 13 shows a circuit diagram of the continuous-time GmC-integrator shown in FIGS. 11–12 with a discrete-time common-mode feedback circuit as an embodiment of the invention.

As shown, x⁺(t) and x⁻(t) are the inputs to the GmC-integrator 1012, which comprises an OTA circuit 1001, two capacitors 1002–1003, and two current sources 1010, 1011.

The OTA circuit 1001 is comprised of seven transistors 1106–1109, 1111–1113 and three current sources 1101–1103. x⁺(t) is coupled to the gate of transistor 1106, while x⁻(t) is coupled to the gate of transistor 1107. The source of transistor 1106 is coupled to the current source 1101, and the drain of the same transistor is coupled to the drain of transistor 1111. The source of transistor 1107 is coupled to the current source 1102 while the drain of the same transistor 1107 is coupled to the drain of transistor 1112.

While current source 1011 is coupled to the integrating capacitor 1002, it is also coupled to the output of the integrator 1004, which becomes the input $V_{op}$ of the DT-CMFB circuit 1007. Current source 1010 is coupled to the other integrating capacitor 1003, and is coupled to the other differential output of the integrator 1006, which becomes the input $V_{om}$ of the DT-CMFB circuit 1007. The DT-CMFB circuit 1007 shown here is the switched-capacitor circuit 500 shown and discussed in FIG. 5.

The current sources 1011 and 1010 are also coupled to the drains of transistors 1108, 1109, respectively. These transistors 1108, 1109 are coupled together at their gates, and their sources are coupled to transistors 1111, 1112, respectively. The gates of transistors 1111, 1112 are coupled together and to the output of the DT-CMFB circuit 1009, which is also $V_{cntrl}$ of the DT-CMFB circuit 1007. The sources of the transistors 1111, 1112 are coupled to ground. The current source 1103 is coupled to both the drain and the gate of transistor 1113, whose gate is also coupled to $V_{bias}$ of the DT-CMFB circuit 1007. The source of the transistor 1113 is coupled to ground.

The terms a or an, as used herein, are defined as one or more than one. The term plurality, as used herein, is defined as two or more than two. The term coupled, as used herein, is defined as connected, although not necessarily directly, and not necessarily mechanically.

All the disclosed embodiments of the invention disclosed herein can be made and used without undue experimentation in light of the disclosure. It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

What is claimed is:

1. A method for continuous-time sigma-delta modulation of an input signal, comprising:
    calculating an integrator input signal as a difference between the input signal and a modulation feedback signal;
    continuous time integrating the integrator input signal to produce an integrator output signal having a common mode voltage;
    determining the common mode voltage of the integrator output signal using a discrete-time process;
    determining an integrator feedback signal as a function of the common-mode voltage;
    maintaining the common mode voltage at a substantially constant value using the integrator feedback signal;
    sampling and quantizing the integrator output signal to produce a sigma-delta modulated output signal; and
    converting the sigma-delta modulated output signal from a digital signal to an analog signal, to produce the modulation feedback signal.

2. The method of claim 1, wherein determining the integrator feedback signal further comprises:
    comparing the common mode voltage to a reference common mode voltage; and
    generating the integrator feedback signal as a function of the difference between the common mode voltage and the reference common mode voltage.

3. The method of claim 2, further comprising generating a bias voltage to adjust the biasing of the continuous-time integrator.

4. An apparatus for a continuous time modulation, comprising:
    an adder to calculate an integrator input signal as a difference between an input signal and a modulation feedback signal;
    a continuous time integrator to integrate said integrator input signal o produce an integrator output signal having a common mode component;
    a discrete-time common mode feedback circuit which produces the integrator feedback signal as a function of the common mode component of said integrator output signal in order to maintain the common mode component at a substantially constant value;
    a quantizer coupled to receive said integrator output signal and to produce a quantized output signal; and
    a digital-to-analog converter coupled to receive the quantized output signal to produce said modulation feedback signal.

5. The apparatus of method 4, further comprising a buffer coupled between the continuous time integrator and the discrete-time common mode feedback circuit.

6. The apparatus of method 4, the discrete-time common mode feedback circuit comprising:
    a plurality of capacitors; and
    a first and second set of switching elements coupled to the plurality of capacitors and operable to adjust an equivalent resistance of the plurality of capacitors.

7. The apparatus of claim 6, the first and second sets of switching elements having different on times.

8. The apparatus of claim 6, wherein the first and second sets of switching elements control a transistor biasing voltage and a common mode control voltage.

9. The apparatus of method 4, wherein the discrete-time common mode feedback circuit comprises:
    a plurality of capacitors; and
    a first, second, third and fourth set of switching elements coupled to the plurality of capacitors and operable to adjust an equivalent resistance of the plurality of capacitors.

10. The apparatus of claim 9, wherein the first and second sets of switching elements have different on times.

11. The apparatus of method 10, wherein the first and second sets of switching elements adjust a transistor biasing voltage.

12. The apparatus of claim 9, wherein the third and fourth sets of switching elements have different on times.

13. The apparatus of claim 12, wherein the third and fourth sets of switching elements adjust a common-mode control voltage.

14. The apparatus of claim 4, said continuous time integrator comprising an active RC integrator.

15. The apparatus of claim 4, said continuous time integrator comprising an active GmC integrator.

16. An apparatus for continuous time modulation, comprising:
    a continuous time integrator to integrate an input signal to produce an integrator output signal having a common mode portion; and
    a discrete-time common mode feedback circuit which produces an integrator feedback signal as a function of the common mode portion of the integrator output signal, the integrator feedback signal being used by the continuous time integrator to maintain the common mode portion at a substantially constant value.

17. The apparatus of claim 16, further comprising a buffer coupled between the continuous time integrator and the discrete-time common mode feedback circuit.

18. The apparatus of claim 16, the discrete-time common mode feedback circuit comprising:
a plurality of capacitors; and
a first and second set of switching elements coupled to the plurality of capacitors and operable to adjust an equivalent resistance of the plurality of capacitors.

19. The apparatus of claim 18, the first and second sets of switching elements having different on times.

20. The apparatus of claim 18, wherein the first and second sets of switching elements control a transistor biasing voltage and a common mode control voltage.

21. The apparatus of claim 16, wherein the discrete-time common mode feedback circuit comprises:
a plurality of capacitors; and
a first, second, third and fourth set of switching elements coupled to the plurality of capacitors and operable to adjust an equivalent resistance of the plurality of capacitors.

22. The apparatus of claim 21, wherein the first and second sets of switching elements have different on times.

23. The apparatus of claim 22, wherein the first and second sets of switching elements adjust a transistor biasing voltage.

24. The apparatus of claim 21, wherein the third and fourth sets of switching elements have different on times.

25. The apparatus of claim 24, wherein the third and fourth sets of switching elements adjust a common-mode control voltage.

26. The apparatus of claim 16, said continuous time integrator comprising an active RC integrator.

27. The apparatus of claim 16, said continuous time integrator comprising an active GmC integrator.

28. An electronic apparatus, comprising:
a continuous time integrator to integrate an input signal to produce an integrator output signal having a common mode portion; and
a discrete-time common mode feedback circuit which produces an integrator feedback signal as a function of the common mode portion of the integrator output signal, the integrator feedback signal being used by the continuous time integrator to maintain the common mode portion at a substantially constant value.

29. The electronic apparatus of claim 28, wherein the electronic apparatus is a cellular phone.

* * * * *

UNITED STATES PATENT AND TRADEMARK OFFICE
CERTIFICATE OF CORRECTION

PATENT NO. : 6,697,001 B1
DATED : February 24, 2004
INVENTOR(S) : Oliaei et al.

It is certified that error appears in the above-identified patent and that said Letters Patent is hereby corrected as shown below:

Column 10,
Line 11, delete "o" and insert the word -- to -- therefor.

Signed and Sealed this

Thirteenth Day of July, 2004

JON W. DUDAS
*Acting Director of the United States Patent and Trademark Office*